United States Patent
Choi

(10) Patent No.: US 6,529,433 B2
(45) Date of Patent: Mar. 4, 2003

(54) REFRESH MECHANISM IN DYNAMIC MEMORIES

(75) Inventor: Joo-Sun Choi, Kyungki-do (KR)

(73) Assignee: Hynix Semiconductor, Inc., Seoul (KR)

( * ) Notice: Subject to any disclaimer, the term of this patent is extended or adjusted under 35 U.S.C. 154(b) by 0 days.

(21) Appl. No.: 09/826,288

(22) Filed: Apr. 3, 2001

(65) Prior Publication Data

US 2002/0141267 A1 Oct. 3, 2002

(51) Int. Cl.[7] .................................................. G11C 7/00
(52) U.S. Cl. ................................... 365/222; 365/230.03
(58) Field of Search ............................ 365/222, 230.03

(56) References Cited

U.S. PATENT DOCUMENTS

| | | | |
|---|---|---|---|
| 4,636,989 A | 1/1987 | Ikuzaki ........................ | 365/222 |
| 5,629,898 A | 5/1997 | Idei et al. .................... | 365/222 |
| 6,134,169 A | 10/2000 | Tanaka ........................ | 365/222 |
| 6,310,814 B1 * | 10/2001 | Hampel et al. ............. | 365/222 |

FOREIGN PATENT DOCUMENTS

JP 0007592 * 1/1988 ........... G11C/11/34

OTHER PUBLICATIONS

Betty Prince, "Semiconductor Memories", 1983, Wiley, 2$^{nd}$ edition, pp. 220–222.*

* cited by examiner

*Primary Examiner*—M. Tran
(74) *Attorney, Agent, or Firm*—Townsend and Townsend and Crew LLP

(57) ABSTRACT

In accordance with an embodiment of the present invention, a semiconductor memory includes first and second banks of memory cells configured such that in a refresh cycle no operation is performed in one of the first and second banks while a content of each of a predesignated number of cells in the other one of the first and second banks is being refreshed. In one embodiment, in two consecutive refresh cycles a content of each of an equal number of cells in each of the first and second banks are refreshed, and during one of the two refresh cycles no operation is performed in the first bank, and during the other one of the two refresh cycles no operation is performed in the second bank.

66 Claims, 5 Drawing Sheets

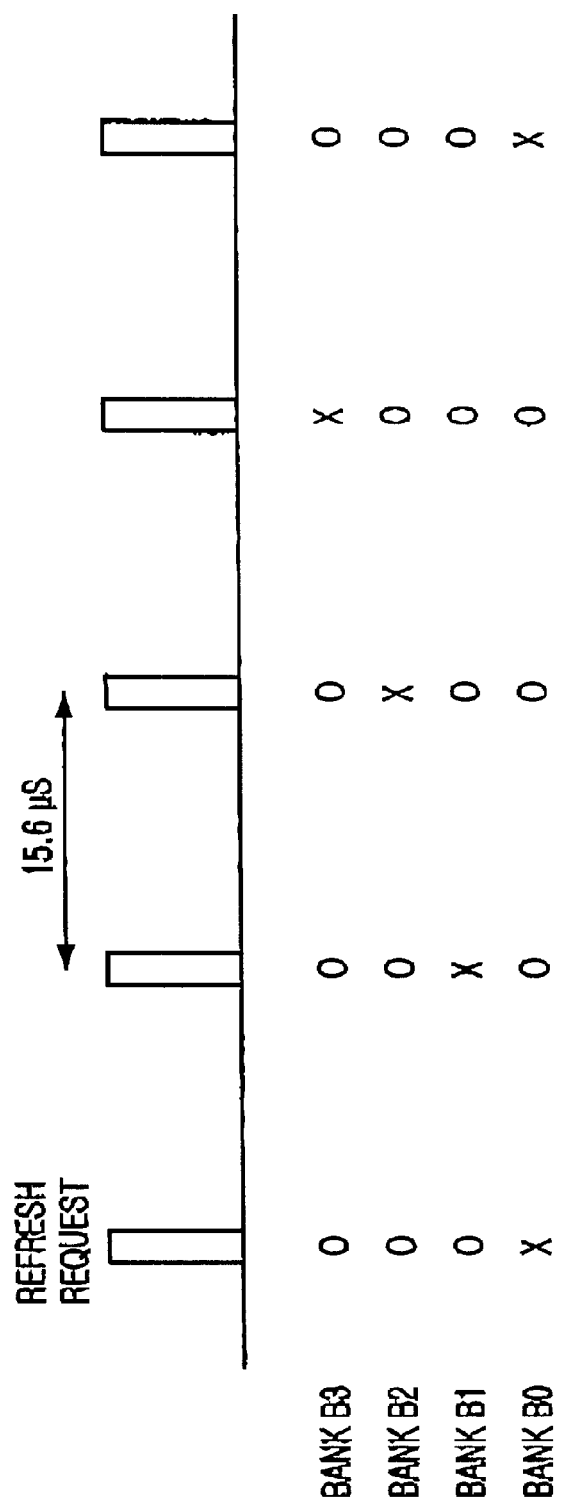

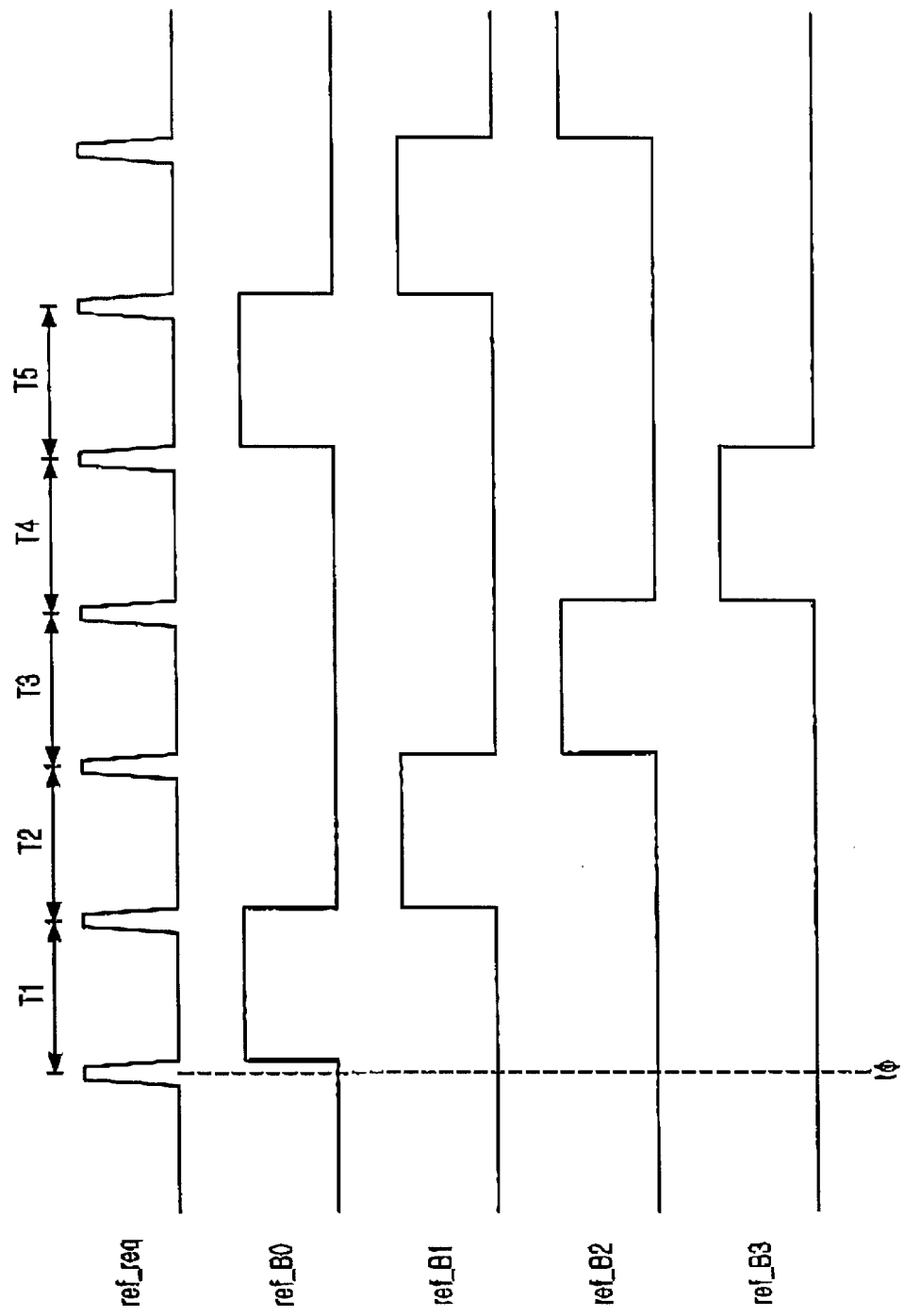

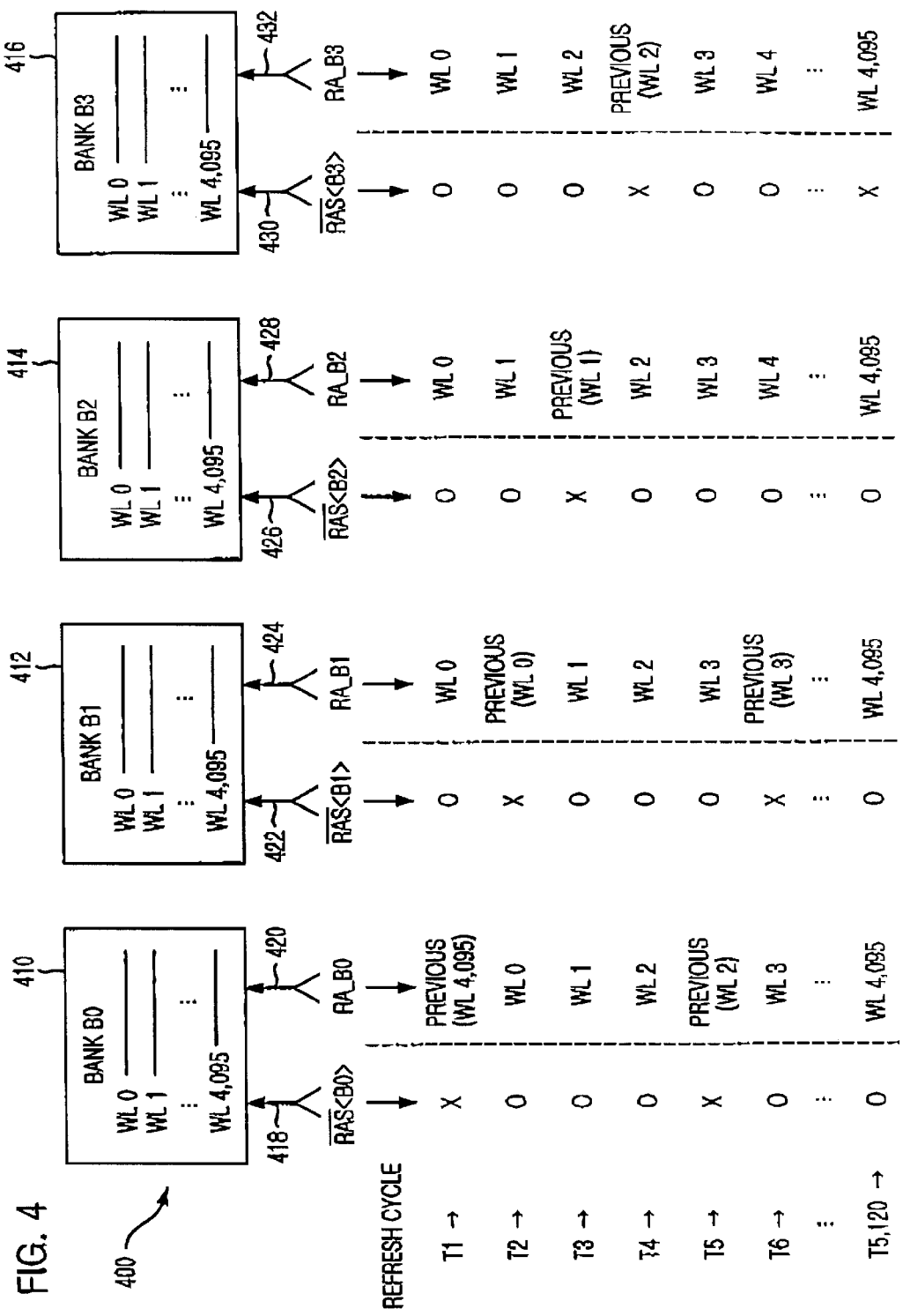

REFRESH MECHANISM IN DYNAMIC MEMORIES

BACKGROUND OF THE INVENTION

Dynamic random access memories (DRAMs) require periodic refresh operations to prevent loss of memory cell data due to cell leakage. In some conventional DRAMs, an auto-refresh operation is initiated upon receipt of a refresh command as defined by a specific combination of logic levels externally provided on each of the DRAM control pins, such the $\overline{CS}$, $\overline{RAS}$, $\overline{CAS}$, and $\overline{WE}$ pins. In response to the refresh command, a refresh address is produced by an internal refresh address counter so as to select a wordline in the memory array. The data in each memory cell along the selected row is transferred to a corresponding bitline. The data on each bitline is amplified by a corresponding sense amplifier and re-written in the same memory cell. The bitlines and sense amplifiers are then automatically pre-charged. The refresh address output from the internal refresh address counter is then updated to successively refresh subsequent row addresses until all rows of cells are refreshed.

For some conventional DRAMs, refresh operation, as defined by the JEDEC standard, is to be performed in 4,096 (4K) refresh cycles over a 64 mS period. The 64 mS period reflects the data retention capability of the DRAM cell technology (i.e., the cell data need to be refreshed at least every 64 mS period to prevent loss of data). The 4K refresh cycles over 64 mS translates to 15.6 uS per refresh cycle.

During each refresh cycle, a RAS operation is performed followed by a precharge operation as described above. In multi-bank DRAMs, the RAS-precharge sequence is simultaneously carried out in all banks. Alternatively, in a refresh cycle, a RAS-precharge sequence may be carried out in some of the banks while another type of operation (such as read or write) is simultaneously carried out in the remaining banks. In either approach, power consumption is high since all banks are active simultaneously during each refresh cycle. Further, as the memory density increases, for the same 4K cycles and 64 mS requirement, a greater number of wordlines need to be simultaneously refreshed in each refresh cycle in order to refresh all rows during the 64 mS period. This further exacerbates the power consumption problem.

Given the stringent battery requirements of portable devices, and the increasing demand for higher density DRAMs for use in such portable devices, it is desirable to minimize the power consumption during refresh operations.

BRIEF SUMMARY OF THE INVENTION

In accordance with one embodiment of the present invention, a semiconductor memory includes first and second banks of memory cells configured such that in a refresh cycle no operation is performed in one of the first and second banks while a content of each of a predesignated number of cells in the other one of the first and second banks is being refreshed.

In another embodiment, in two consecutive refresh cycles a content of each of an equal number of cells in each of the first and second banks are refreshed, and during one of the two refresh cycles no operation is performed in the first bank, and during the other one of the two refresh cycles no operation is performed in the second bank.

In another embodiment, in a predesignated number of refresh cycles each having a predesignated time period a content of each cell along all rows of cells in each of the first and second banks is refreshed, wherein no operation is performed in one of the first and second banks in each of the predesignated number of refresh cycles.

In another embodiment, the memory further includes a refresh address generator coupled to provide an address to said other one of the first and second banks for selecting the predesignated number of cells, and a bank-access block coupled to provide first and second access signals to the first and second banks. One of the first and second access signals inhibits access to said one of the first and second banks so that no operation is performed in said one of the first and second banks during the refresh cycle, and the other one of the first and second access signals enables access to said other one of the first and second banks to refresh a content of each of the predesignated number of cells in the refresh cycle.

In another embodiment, the memory further includes a bank-select logic configured to receive a refresh request signal on an input terminal and in response generate a bank select signal, the refresh-address generator being configured to receive the bank select signal and in response generate the address for selecting the predesignated number of cells, and the bank-access block being configured to receive the bank select signal and in response generate the first and second bank access signals. In another embodiment, the bank select signal comprises a first select signal being in a first state when the first bank is to remain non-operational in a refresh cycle, and a second select signal being in a first state when the second bank is to remain non-operational in a refresh cycle.

In another embodiment, the bank select logic includes a counter circuit configured to receive the refresh request signal and in response generate a count signal, and a decode circuit configured to receive the count signal and in response generate the first and second select signals.

In another embodiment, the refresh address generator includes a bank control block configured to receive the first and second select signals and in response generate first and second bank control signals, and a refresh row address generator configured to receive the first bank control signal and in response generate a first address coupled to the first bank for selecting a predesignated number of cells in the first bank, and to receive the second bank control signal and in response generate a second address coupled to the second bank for selecting a predesignated number of cells in the second bank.

In another embodiment, the refresh row address generator includes a first counter circuit configured to receive the first block control signal and in response generate the first address at its output, and a second counter circuit configured to receive the second block control signal and in response generate the second address at its output, wherein in a refresh cycle, only one of the first and second counter circuits updates its address output in response to the first and second bank control signals.

In accordance with another embodiment of the present invention, a method of operating a semiconductor memory having first and second banks of memory cells includes: in a refresh cycle, refreshing a content of each of a predesignated number of cells in one of the first and second banks while no operation is performed in the other one of the first and second banks.

In another embodiment, the method further includes: in two consecutive refresh cycles, refreshing a content of each of an equal number of cells in each of the first and second banks, wherein during one of the two refresh cycles no operation is performed in the first bank, and during the other one of the two refresh cycles no operation is performed in the second bank.

In another embodiment, the method further includes: performing a predesignated number of refresh cycles each having a predesignated time period so that a content of each cell along all rows of cells in each of the first and second banks is refreshed, wherein no operation is performed in one of the first and second banks in each of the predesignated number of refresh cycles.

In another embodiment wherein the memory comprises a refresh address generator and a bank access block, the method further includes: the refresh address generator providing an address to said one of the first and second banks for selecting the predesignated number of cells in the refresh cycle, and the bank access block providing first and second access signals to the first and second banks, one of the first and second access signals inhibiting access to said other one of the first and second banks so that no operation is performed in said other one of the first and second banks during the refresh cycle, and the other one of the first and second access signals enabling access to said one of the first and second banks to refresh a content of each of the predesignated number of cells in the refresh cycle.

In another embodiment wherein the memory further includes a bank select logic, the method further includes: the bank select logic generating a bank select signal in response to a refresh request signal, the refresh-address generator generating the address for selecting the predesignated number of cells in response to the bank select signal, and the bank-access block generating the first and second bank access signals in response to the bank select signal.

In another embodiment, the bank select signal comprises a first select signal being in a first state when the first bank is to remain non-operational in a refresh cycle, and a second select signal being in a first state when the second bank is to remain non-operational in a refresh cycle.

In another embodiment, the method further includes: the refresh-address generator generating a first address in response to the first select signal, and a second address in response to the second select signal, the first address being coupled to the first bank and the second address being coupled to the second bank.

In another embodiment wherein in the bank select logic comprises a counter circuit and a decode circuit the method further includes; the counter circuit generating a count signal in response to the refresh request signal, and the decode circuit generating the first and second select signals in response to the count signal.

In another embodiment wherein the refresh address generator comprises a bank control block and a refresh row address generator, the method further includes: the bank control block generating first and second bank control signals in response to the first and second select signals, and the refresh row address generator generating a first address in response to the first bank control signal for selecting a predesignated number of cells in the first bank, and a second address in response to the second bank control signal for selecting a predesignated number of cells in the second bank.

In another embodiment wherein the refresh row address generator comprises first and second counter circuits, the method further includes: generating the first address in response to the first block control signal, generating the second address in response to the second block control signal, and in a refresh cycle, updating only one of the first and second addresses in response to the first and second select signals.

The following detailed description and the accompanying drawings provide a better understanding of the nature and advantages of the present invention.

BRIEF DESCRIPTION OF THE DRAWINGS

FIG. 1 shows a DRAM bank selection scheme in accordance with an exemplary embodiment of the present invention;

FIG. 3 shows a timing diagram used to illustrate the operation of the FIG. 2 block diagram; and FIG. 4 includes a block diagram and a table illustrating the bank and wordline selection scheme in accordance with one embodiment of the invention.

DETAILED DESCRIPTION OF THE INVENTION

As DRAM technology advances, the charge retention capability of DRAM cells improve. In accordance with an embodiment of the present invention, power consumption during each refresh cycle is reduced by a technique that takes advantage of the improved charge retention capability of DRAM cells. In a multi-bank DRAM architecture, a lower power consumption is obtained by keeping at least one of the banks idle (i.e., inactive) during each refresh cycle. For example, in a DRAM having four memory banks, by keeping one of the four banks idle during each refresh cycle, the power consumption in each refresh cycle is reduced by one quarter compared to conventional DRAMs. This of course requires that the total number of refresh cycles and the total refresh time be increased to, for example, 6K cycles over a 96 mS time period, in order to refresh every cell.

FIG. 1 shows a DRAM bank selection scheme for a four bank DRAM architecture (not shown) in accordance with an exemplary embodiment of the present invention. Letter "X" indicates an idle bank and letter "O" indicates an activated bank. FIG. 1 shows a refresh request being asserted every 15.6 uS. In response to each refresh request, at least one row of cells in each of three of the four banks is refreshed. As indicated in FIG. 1, in response to the first refresh request, one or more rows of cells in each of banks B1, B2, B3 are simultaneously refreshed while bank 0 remains idle; and in response to the second refresh request, one or more rows of cells in each of banks B0, B2, B3 are refreshed while Bank 1 remains idle; and so on. The refresh requests are continued until all rows of cells in all banks are refreshed. The order in which banks are kept idle is illustrative, and other non-sequential order, e.g., interleaved, can also be implemented.

Figure 2A:
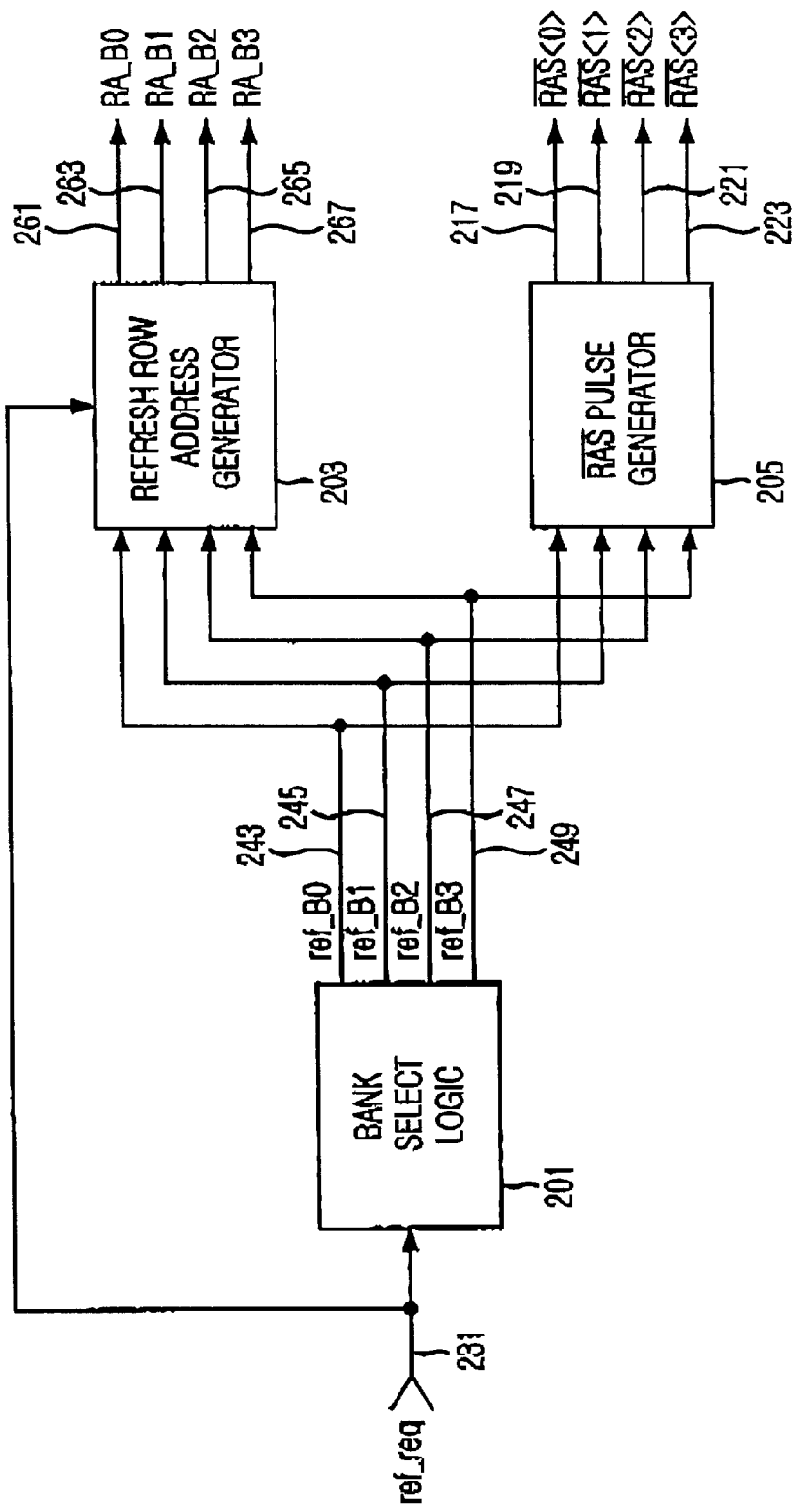
FIG. 2a shows a block diagram of a portion of a refresh circuit for implementing a refresh operation in accordance with one embodiment of the present invention.

An exemplary embodiment of the present invention implementing the above refresh technique for a four bank DRAM architecture is shown in FIG. 2a. The operation of FIG. 2a will be described with the aid of the timing diagram shown in FIG. 3. A bank-select-logic block 201 receives a refresh request (ref_req) signal on an input terminal 231. In response to the ref_req signal, logic block 201 generates a pulse signal ref_Bi on one of its four output terminals 243, 245, 247, 249. As shown in FIG. 3, in every four consecutive refresh cycles, four pulses are generated by logic block 201, one on each of its four output terminals. Logic block 201 generates a ref_B0 pulse signal on terminal 243 in the first refresh cycle, a ref_B1 pulse signal on terminal 245 in the second refresh cycle, a ref_B2 pulse signal on terminal 247 in the third refresh cycle, and a ref_B3 pulse on terminal 249 in the fourth refresh cycle.

The four signals ref_B0 through ref_B3 are coupled to a respective one of four input terminals of each of a refresh-row-address-generator block 203 and a $\overline{RAS}$ pulse generator block 205. Block 203 also receives the ref_req signal which functions to enable block 203 during refresh operations, and disable block 203 in all other types of operations. In response to the ref_B0 to ref_B3 signals, block 203 generates row address signals RA_B0, RA_B1, RA_B2, RA_B3 on respective output terminals 261, 263, 265, 267. These refresh row address signals are coupled to corresponding row decoders (not shown) for selecting rows in the corresponding banks B0, B1, B2, B3.

In response to the ref_B0 to ref_B3 signals, $\overline{RAS}$ pulse generator block 205 generates $\overline{RAS}$<0> to $\overline{RAS}$<3> signals on respective output terminals 217, 219, 221, 223. The $\overline{RAS}$<0> to $\overline{RAS}$<3> signals are respectively coupled to corresponding banks B0 to B3 for initiating row access operations in these banks. In one embodiment, block 205 also receives the ref_req signal for enabling block 205 to respond to signals ref_B0 to ref_B3 during refresh operations.

In FIG. 3, at time $t_0$, a first refresh cycle T1 is initiated by the ref_req signal. In response to the ref_req signal, bank select logic block 201 generates a ref_B0 pulse while keeping ref_B1, ref_B2, and ref_B3 signals low. The ref_B0 pulse signal inhibits the $\overline{RAS}$ pulse generator block 205 from generating a $\overline{RAS}$<0> pulse, thus keeping bank B0 idle. The low level of ref_B, ref_B2, ref_B3 signals allow the $\overline{RAS}$ pulse generator block 205 to generate $\overline{RAS}$<1>, $\overline{RAS}$<2>, and $\overline{RAS}$<3> pulses, thus initiating a row access operation in each of banks B1, B2, B3.

Refresh-row-address-generator block 203, in response to the ref_req signal, the ref_B0 pulse signal, and the low state of ref_B1, ref_B2, ref_B3 signals, provides new refresh row addresses RA_B1, RA_B2, RA_B3 to banks B1, B2, B3 respectively, while keeping the refresh row address RA_B0 unchanged from the previous refresh cycle. Accordingly, a new row is selected in each of banks B1, B2, B3, while in bank B0 the previously selected row remains unchanged. Thus, during the refresh cycle T1, because a $\overline{RAS}$ pulse is generated only for banks B1, B2, B3, the cells along the newly selected row in each of these banks are refreshed, while bank B0 remains idle.

In the second refresh cycle T2, in response to a new ref_req signal, the bank select logic blocks 201 generates a ref_B1 pulse signal while keeping ref_B0 ref_B2, and ref_B3 signals low. This inhibits the generation of a $\overline{RAS}$<1> pulse thus keeping bank B1 idle, while a $\overline{RAS}$<0> pulse, a $\overline{RAS}$<2> pulse, and a $\overline{RAS}$<3> pulse are generated, thus initiating a row access operation in each of respective banks B0, B2, B3. Also, the refresh row-address-generator block 203 provides new refresh row addresses RA_B0, RA_B2, RA_B3 to banks B1, B2, B3 respectively, while keeping the refresh row address RA_B1 unchanged. Thus, during the refresh cycle T2, because a $\overline{RAS}$ pulse is generated only for banks B0, B2, B3, the cells along the newly selected row in each of banks B0, B2, B3 are refreshed, while bank B0 remains idle.

Additional refresh cycles are similarly performed until all rows of all four banks are cycled through and refreshed. In one embodiment, each refresh cycle is 16 uS, and a total of 6,144 (6K) refresh cycles are carried out to completely refresh every cell in the memory. Thus, in a 96 mS period, all four banks are fully refreshed. This is made possible in part by the fact that the memory retention in current DRAM technologies has improved. In some current DRAM technologies the memory retention time is in the range of 200–250 ms.

FIG. 4 includes a block diagram and a table, and is provided to more clearly illustrate the bank selection scheme in accordance with one embodiment of the invention. In FIG. 4, a simplified memory 400 having four banks B0 (410), B1 (412), B2 (414), B3 (416) is shown. Each bank has 4,096 (4K) rows, and each row is labeled as wordline WLi. Accordingly, each bank is shown as having WL0 through WL4,095 wordlines. Banks B0, B1, B2, B3 respectively receive $\overline{RAS}$<B0>, $\overline{RAS}$<B1>, $\overline{RAS}$<B2>, and $\overline{RAS}$<B3> pulse signals from the $\overline{RAS}$ pulse generator block 205 (FIG. 2a) on the respective terminals 418, 422, 426, and 430. Banks B0, B1, B2, B3 also respectively receive RA_B0, RA_B1, RA_B2, and RA_B3 signals from the refresh-row-address-generator block 203 (FIG. 2a) on the respective terminals 420, 424, 428, and 432.

Along the far left column of the table directly below the four banks, 5K refresh cycles are symbolically listed starting with cycle T1 and ending with cycle T5,120. In each row of the table the selected wordline WLi and the state of the $\overline{RAS}$<Bi> pulse for each of the four memory banks are indicated. The entries in each column correspond to the signal below which they appear. The letter "X" indicates that the $\overline{RAS}$<Bi> pulse signal to which it corresponds is not generated, and thus the bank to which it corresponds remains idle during the refresh cycle to which it corresponds. The letter "O" indicates that the $\overline{RAS}$<Bi> pulse signal to which it corresponds is generated, and thus a row access cycle is initiated in the bank to which it corresponds during the refresh cycle to which it corresponds.

Each WLi entry in the table indicates the wordline that is selected in the corresponding bank during the refresh cycle to which it corresponds. Also, each WLi entry corresponds to the refresh row address signal RA_Bi under which it appears (e.g., in cycle T3, WL1 is selected in bank B0 in response to refresh row address signal RA_B0).

As shown, in refresh cycle T1, $\overline{RAS}$<Bi> pulse signal is generated for banks Bi, B2, B3, but not for bank B0. Thus, bank B0 remains idle during cycle T1 while a row access operation is initiated in each of banks B1, B2, B3. Also, during cycle T1, all refresh address signals RA_Bi are updated to select a new row in each bank except the RA_B0 signal for bank B0. Thus, in bank B0 the previously selected wordline (i.e., WL4,095) remains unchanged, while in each of banks B1, B2, B3 a new wordline (i.e., WL0) is selected. Therefore, in cycle T1, the cells along wordline WL0 of each of banks B1, B2, B3 are refreshed while bank B0 remains idle.

In refresh cycle T2, $\overline{RAS}$<Bi> pulse signal is generated for banks B0, B2, B3, but not for bank B1. Thus, bank B1 remains idle during cycle T2 while a row access operation is initiated in banks B0, B2, B3. Also, during cycle T2, all refresh address signals RA_Bi are updated to select a new row in each bank except the RA_B1 signal for bank B1. Thus, in bank B1 the previously selected wordline (i.e., WL0) remains unchanged, while in each of banks B0, B2, B3 a new wordline is selected. Therefore, in cycle T2, the cells along wordline WL0 in bank B0 and wordline WL1 in each of banks B2, and B3 are refreshed while bank B1 remains idle.

In this manner, by the end of the fourth cycle T4, the cells along three wordlines (WL0, WL1, WL2) in each of the four memory banks are refreshed, while one of fours banks is kept idle in each refresh cycle. Accordingly, as indicated in the table, a total of 5K refresh cycles is need to refresh the 4K rows of cells in each of the memory banks.

The order in which the banks are kept idle and the order in which the wordlines are selected are both shown to be sequential, however the invention is not limited as such. Other orders, such as interleaved, may also be implemented by properly modifying the counter circuits, as is well known in the art.

Figure 2B:
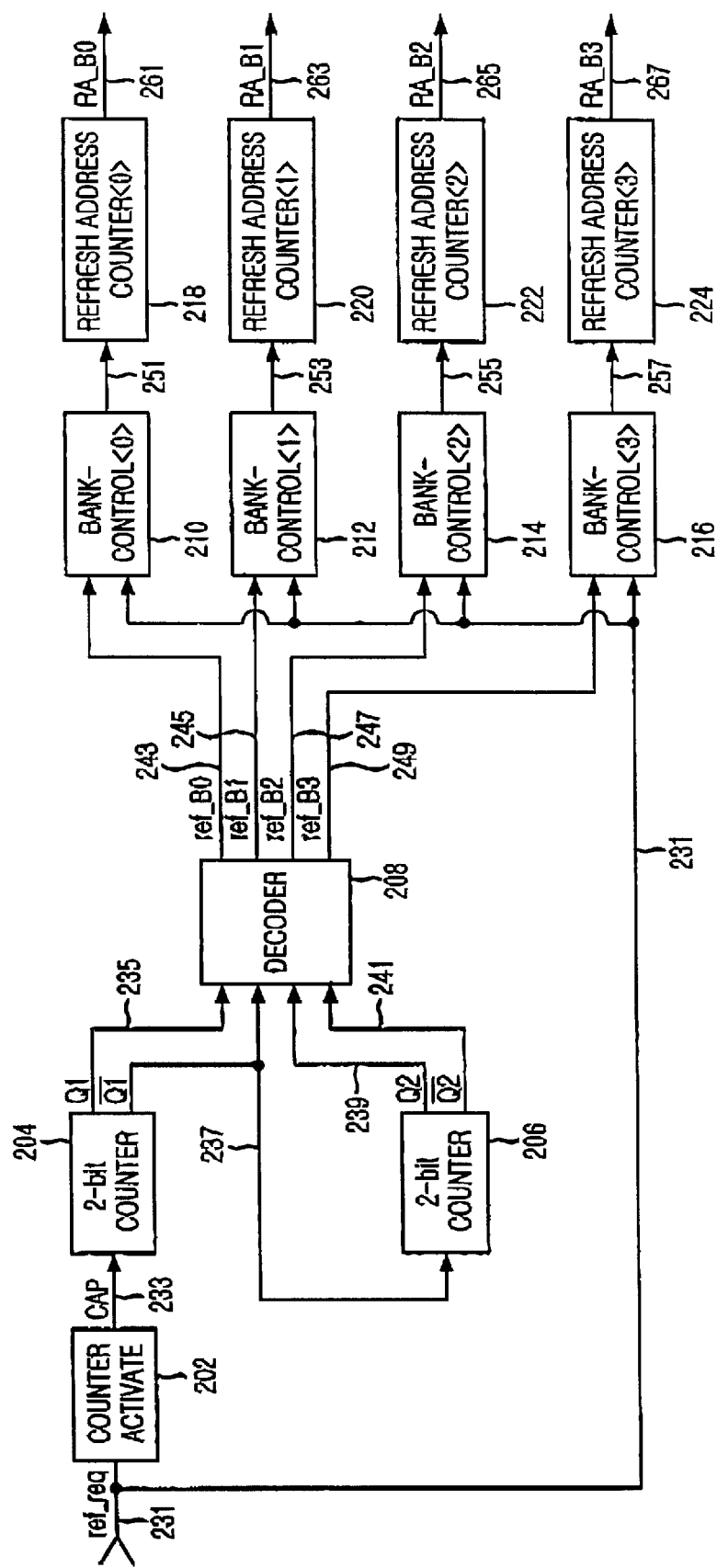
FIG. 2b shows a more detailed implementation of the block diagram of FIG. 2a in accordance with one embodiment of the present invention.

FIG. 2b shows a more detailed implementation of a portion of the block diagram of FIG. 2a in accordance with one embodiment of the present invention. The bank select logic block 201 of FIG. 2a is shown in FIG. 2b as including a counter-activate block 202, a 2-bit counter comprising blocks 204 and 206, and a decoder block 208. The refresh-row-address-generator block 203 of FIG. 2a is shown in FIG. 2b as including bank-control blocks 210, 212, 214, 216, and refresh-address-counter blocks 218, 220, 222, 224. A detailed implementation of the $\overline{RAS}$ pulse generator block 205 of FIG. 2a is not provided in FIG. 2b since such implementation would be obvious to one skilled in art in light of the operational description provided above.

As shown in FIG. 2b, counter-activate block 202 receives a ref_req signal on an input terminal 231. Signal ref_req is generated by a command-decode block (not shown) in response to an externally provided auto-refresh command. An output terminal of counter-activate block 202 is coupled to an input terminal of a counter block 204 via terminal 233.

Two blocks 204 and 206 are coupled together to form a 2-bit bank counter. Each of the blocks 204, 206 provides a pair of complementary output signals Q and $\overline{Q}$. Block 204 generates Q1 and $\overline{Q1}$ signals on terminals 235 and 237 respectively, and block 206 generates Q2 and $\overline{Q2}$ signals on terminals 239 and 241 respectively. Output terminal 237 carrying the $\overline{Q1}$ signal is coupled to an input of block 206. Blocks 204, 206 operate to increment an output count Q1, Q2 in response to the CAP signal on terminal 233. Conventional counter circuits can be used to implement the counter function performed by blocks 204, 206.

Decoder block 208 receives and decodes Q1, $\overline{Q1}$, Q2, and $\overline{Q2}$ signals, and generates a pulse signal on one of its four output terminals 243, 245, 247, 249. Decoder block 208 generates a pulse ref_B0 (see FIG. 3) on terminal 243 when Q1, Q2 is in the 0,0 binary state; generates a pulse ref_B1 on terminal 245 when Q1, Q2 is in the 0,1 binary state; generates a pulse ref_B2 on terminal 247 when Q1, Q2 is in the 1,0 binary state; and generates a pulse ref_B3 on terminal 249 when Q1, Q2 is the 1,1 binary state. Conventional decoding circuits can be used to implement this decoding function. The specific decoding of Q1 and Q2 described above is merely illustrative, and other decoding schemes well known in the art are also possible.

The ref_B0 through ref_B3 signals are respectively coupled to a first input terminal of bank-control blocks 210, 212, 214, 216. Each of the four bank-control blocks has a second input terminal coupled to receive the ref_req signal on terminal 231. The ref_req signal enables the bank-control blocks during refresh operations, and disables them during non-refresh operations. Each of the bank-control blocks 210, 212, 214, 216 has a respective output terminal 251, 253, 255, 257 coupled to an input terminal of a respective refresh-address-counter 218, 220, 222, 224. The refresh-address-counter blocks in turn generate row address signals RA_B0, RA_B1, RA_B2, RA_B3 on output terminals 261, 263, 265, 267 respectively. The refresh row address signals are coupled to corresponding row decoders (not shown) for selecting rows in the corresponding banks B0, B1, B2, B3.

As described in connection with FIG. 2a, the ref_B0 through ref_B3 signals generated by the decoder 208 are also coupled to a $\overline{RAS}$ pulse generation block (not shown in FIG. 2b) which generates $\overline{RAS}$ pulses to initiate a row access operation in one or more of the banks in accordance with the state of the ref_B0 through ref_B3 signals.

In FIG. 3, at time t0, a first refresh cycle T1 is initiated by the ref_req signal. In response to the ref_req signal, counter-activate block 202 generates a counter activate pulse CAP on terminal 233. In response to the CAP signal, the 2-bit counter (blocks 204, 206) updates the Q1,Q2 count to 0,0. This causes decoder 208 to generate a ref_B0 pulse, and keep ref_B1 ref_B2, and ref_B3 signals low. The ref_B0 pulse inhibits the generation of a $\overline{RAS}$ pulse for bank B0 thus keeping bank B0 idle during the T1 refresh cycle. The low level of ref_B1, ref_B2, ref_B3 signals allow a $\overline{RAS}$ pulse to be generated for each of banks B1, B2, B3, thus initiating a row access operation in each of these banks during refresh cycle T1.

Bank-control block 210, in response to the ref_B0 pulse signal, inhibits the refresh-address-counter block 218 from updating the refresh row address RA_B0. At the same time, the bank control blocks 212, 214, 216, in response to ref_B1, ref_B2 ref_B3 signals, cause the refresh-address-counter blocks 220, 22, 224 to update their refresh row addresses RA_B1, RA_B2, RA_B3. Accordingly, a new row is selected in each of banks B1, B2, B3, while in bank B0 the previously selected row remains unchanged. Thus, during the refresh cycle T1, because a $\overline{RAS}$ pulse is generated only for banks B1, B2, B3, the cells along the newly selected row in each of banks B1, B2, B3 are refreshed, while bank B3 remains idle.

In the second refresh cycle T2, the two-bit counter (blocks 204, 206) updates the count Q1,Q2 at its outputs to 0,1 in response to the new ref_req signal. This causes decoder 208 to generate a ref_B1 pulse signal while keeping ref_B0, ref_B2 and ref_B3 signals low. This inhibits the generation of a $\overline{RAS}$ pulse for bank B1 thus keeping bank B1 idle, while a $\overline{RAS}$ pulse is generated for each of banks B0, B2, B3 thus initiating a row access operation in each of these banks. Accordingly, the refresh-address-counter blocks 218, 222, 224 update their refresh row addresses RA_B1, RA_B2, RA_B3, while the refresh-address-counter block 220 keeps the refresh row address RA_B1 unchanged. Thus, during the refresh cycle T2, because a $\overline{RAS}$ pulse is generated only for banks B0, B2, B3, the cells along the newly selected row in each of banks B0, B2, B3 are refreshed, while bank B0 remains idle.

The present invention is not limited to completing a refresh operation within 6K refresh cycles of 16 uS per cycle. The invention may be modified to accommodate other designations of number of cycles and cycle times. Specifically, depending on the memory density, and the designated number of refresh cycles within which the refresh operation must be complete, the diagram of FIG. 2 can be modified, in light of the above description, to ensure that all rows are refreshed by the end of the designated number of refresh cycles, while at least one bank is kept idle during each refresh cycle.

Although in some of the above examples, one row of cells is refreshed in each refresh cycle, the invention is not limited as such. Depending on the total number of rows in each bank and the designated total number of refresh cycles, more than one row of cells may need to be refreshed in each refresh cycle to ensure that all rows of cells are refreshed within the designated total number of refresh cycles.

As can be seen from the above examples, the power consumption during each refresh operation is reduced by one quarter by keeping one of the four banks idle during each refresh cycle. The power consumption can be further reduced by keeping two or more of the banks idle during each refresh cycle. However, the maximum number of banks which can be kept idle in each refresh cycle is limited by the cell retention capability, and the designated total number of refresh cycles.

In another embodiment of the four bank configuration, while a refresh operation is being carried out in first and second banks, a third bank is kept idle, and one of a read, write, or precharge operation is carried out in a fourth bank. In this manner, the power advantages of having one bank idle is maintained while two distinct operations are performed in parallel during each refresh cycle.

Although a four bank DRAM configuration is used to illustrate the different advantageous features of the present invention, other bank configurations can be implemented by one skilled in the art in light of the above description. For example, in an eight bank configuration, the 2-bit counter blocks 204, 206 in FIG. 2 may be replaced with 3-bit counter blocks, with the decoder block 208 providing eight ref_Bi signals, one for each of the eight banks. Other blocks in FIG. 2 can be similarly modified to implement the function of keeping one or more of the eight banks idle during each refresh cycle.

The above description is illustrative and not restrictive. The scope of the invention should, therefore, be determined not with reference to the above description, but instead with reference to the appended claims along with their full scope of equivalents.

What is claimed is:

1. A semiconductor memory comprising:
    first and second banks of memory cells configured such that in a refresh cycle no operation is performed in one of the first and second banks while a content of each of a predesignated number of cells in the other one of the first and second banks is being refreshed;
    a refresh address generator coupled to provide an address to said other one of the first and second banks for selecting the predesignated number of cells; and
    a bank-access block coupled to provide first and second access signals to the first and second banks, one of the first and second access signals inhibiting access to said one of the first and second banks so that no operation is performed in said one of the first and second banks during the refresh cycle, and the other one of the first and second access signals enabling access to said other one of the first and second banks to refresh a content of each of the predesignated number of cells in the refresh cycle.

2. The memory of claim 1 wherein in two consecutive refresh cycles a content of each of an equal number of cells in each of the first and second banks are refreshed, and during one of the two refresh cycles no operation is performed in the first bank, and during the other one of the two refresh cycles no operation is performed in the second bank.

3. The memory of claim 2 wherein by the end of the two refresh cycles a content of each of an equal number of rows of cells in each of the first and second banks are refreshed.

4. The memory of claim 1 wherein in a predesignated number of refresh cycles each having a predesignated time period a content of each cell along all rows of cells in each of the first and second banks is refreshed, wherein no operation is performed in one of the first and second banks in each of the predesignated number of refresh cycles.

5. The memory of claim 1 wherein the predesignated number of cells is one or more rows of cells and the address is a row address.

6. The memory of claim 1 further comprising a bank-select logic configured to receive a refresh request signal on an input terminal and in response generate a bank select signal, the refresh-address generator being configured to receive the bank select signal and in response generate the address for selecting the predesignated number of cells, and the bank-access block being configured to receive the bank select signal and in response generate the first and second bank access signals.

7. The memory of claim 6 wherein the refresh address generator receives the refresh request signal for enabling the refresh address generator in a refresh operation.

8. The memory of claim 6 wherein the bank select signal comprises a first select signal being in a first state when the first bank is to remain non-operational in a refresh cycle, and a second select signal being in a first state when the second bank is to remain non-operational in a refresh cycle.

9. The memory of claim 8 wherein the refresh-address generator receives the first and second select signals and generates a first address in response to the first select signal and a second address in response to the second select signal, the first address being coupled to the first bank and the second address being coupled to the second bank.

10. The memory of claim 9 wherein in a refresh cycle, the first address remains unchanged if the first select signal is in the first state, but is updated if the first select signal is in a second state, and the second address remains unchanged if the second select signal is in the first state, but is updated if the second select signal is in a second state.

11. The memory of claim 8 wherein the bank access block receives the first and second select signals and generates the first access signal in response to the first select signal, and generates the second access signal in response to the second select signal, the first access signal being coupled to the first bank and the second access signal being coupled to the second bank.

12. The memory of claim 11 wherein the first access signal inhibits access to the first bank if the first select signal is in the first state, but initiates a row access operation in the first bank to refresh a content of each of a predesignated number of cells if the first select signal is in a second state, and the second access signal inhibits access to the second bank if the second select signal is in a first state, but initiates a row access operation in the second bank to refresh a content of each of a predesignated number of cells if the second select signal is in a second state.

13. The memory of claim 8 wherein the bank select logic comprises:
    a counter circuit configured to receive the refresh request signal and in response generate a count signal; and
    a decode circuit configured to receive the count signal and in response generate the first and second select signals.

14. The memory of claim 13 wherein in response to each refresh request signal the counter circuit updates the count signal to a new binary state, and in response to the count signal being in a first binary state the decode circuit generating the first select signal being in a first state, and in response to the count signal being in a second binary state the decode circuit generating the second select signal being in a first state.

15. The memory of claim 8 wherein the refresh address generator comprises:
a bank control block configured to receive the first and second select signals and in response generate first and second bank control signals; and
a refresh row address generator configured to receive the first bank control signal and in response generate a first address coupled to the first bank for selecting a predesignated number of cells in the first bank, and to receive the second bank control signal and in response generate a second address coupled to the second bank for selecting a predesignated number of cells in the second bank.

16. The memory of claim 15 wherein in a refresh cycle the refresh row address generator updates only one of the first and second addresses in response to the first and second select signals.

17. The memory of claim 15 wherein the bank control block is coupled to receive the refresh request signal for enabling the refresh address generator in a refresh operation.

18. The memory of claim 15 wherein the refresh row address generator comprises:
a first counter circuit configured to receive the first block control signal and in response generate the first address at its output; and
a second counter circuit configured to receive the second block control signal and in response generate the second address at its output,
wherein in a refresh cycle, only one of the first and second counter circuits updates its address output in response to the first and second bank control signals.

19. The memory of claim 1 further comprising a third bank of memory cells wherein during the refresh cycle one of a read operation, a write operation, and a precharge operation is carried out in the third bank.

20. The memory of claim 1 further comprising a third bank of memory cells wherein in three consecutive refresh cycles a content of each of an equal number of cells in each of the first, second, and third banks are refreshed, and during each of the three refresh cycles no operation is performed in at least one of the first, second, and third banks.

21. The memory of claim 1 wherein the memory is a DRAM.

22. The memory of claim 6 wherein the refresh request signal is an auto-refresh signal generated in response to a refresh command externally provided to the memory in order to initiate a refresh cycle.

23. The memory of claim 9 wherein in a refresh cycle the refresh address generator updates one of the first and second addresses and maintains the other one of the first and second addresses same as in a previous refresh cycle.

24. A semiconductor memory comprising:
first and second banks of memory cells wherein in a refresh cycle no operation is performed in one of the first and second banks while a content of each of a predesignated number of cells in the other one of the first and second banks is being refreshed;
a bank-select logic coupled to receive a refresh request signal on an input terminal and in response generate a bank select signal;
a refresh address generator coupled to receive the bank select signal and in response provide a first address to the first bank and a second address to the second bank, one of the first and second addresses being the address of the predesignated number of cells; and
a bank-access block coupled to receive the bank select signal and in response provide a first access signal to the first bank and second access signal to the second bank, one of the first and second access signals inhibiting access to said one of the first and second banks so that no operation is performed in said one of the first and second banks during the refresh cycle, and the other one of the first and second access signals enabling access to said other one of the first and second banks to refresh a content of each of the predesignated number of cells in the refresh cycle.

25. The memory of claim 24 wherein in a refresh cycle the refresh address generator updates one of the first and second addresses and maintains the other one of the first and second addresses same as in a previous refresh cycle.

26. The memory of claim 24 wherein the predesignated number of cells is one or more rows of cells, and the first and second addresses are row addresses.

27. The memory of claim 24 wherein in two consecutive refresh cycles a content of each of an equal number of cells in each of the first and second banks are refreshed, and during one of the two refresh cycles no operation is performed in the first bank, and during the other one of the two refresh cycles no operation is performed in the second bank.

28. The memory of claim 27 wherein by the end of the two refresh cycles a content of each of an equal number of rows of cells in each of the first and second banks are refreshed.

29. The memory of claim 27 wherein in a predesignated number of refresh cycles each having a predesignated time period a content of each cell along all rows of cells in each of the first and second banks is refreshed, wherein no operation is performed in one of the first and second banks in each of the predesignated number of refresh cycles.

30. The memory of claim 24 wherein the refresh address generator is coupled to receive the refresh request signal, and generate each of the first address and the second address in response to both the refresh request signal and the bank select signal.

31. The memory of claim 24 wherein the bank select signal comprises a first select signal being in a first state when the first bank is to remain non-operational in a refresh cycle, and a second select signal being in a first state when the second bank is to remain non-operational in a refresh cycle.

32. The memory of claim 31 wherein the refresh address generator receives the first and second select signals and generates the first address in response to the first select signal, and generates the second address in response to the second select signal, wherein in a refresh cycle, the first address remains unchanged if the first select signal is in the first state, but is updated if the first select signal is in a second state, and the second address remains unchanged if the second select signal is in the first state, but is updated if the second select signal is in a second state.

33. The memory of claim 31 wherein the bank access block receives the first and second select signals and generates the first access signal in response to the first select signal, and generates the second access signal in response to the second select signal, wherein the first access signal inhibits access to the first bank if the first select signal is in the first state, but initiates a row access operation in the first bank to refresh a content of each of a predesignated number of cells if the first select signal is in a second state, and the second access signal inhibits access to the second bank if the second select signal is in the first state, but initiates a row access operation in the second bank to refresh a content of each of a predesignated number of cells if the second select signal is in a second state.

34. The memory of claim 31 wherein the bank select logic comprises:
a counter circuit configured to receive the refresh request signal and in response generate a count signal; and
a decode circuit configured to receive the count signal and in response generate the first and second select signals.

35. The memory of claim 34 wherein in response to each refresh request signal the counter circuit updates the count signal to a new binary state, and in response to the count signal being in a first binary state the decode circuit generates the first select signal being in a first state, and in response to the count signal being in a second binary state the decode circuit generates the second select signal being in a first state.

36. The memory of claim 34 wherein the refresh address generator comprises:
a bank control block configured to receive the first and second select signals and the refresh request signal, and provide a first bank control signal in response to both the first select signal and the refresh request signal, and provide a second bank control signal in response to both the second select signal and the refresh request; and
a refresh row address generator configured to receive the first bank control signal and in response generate the first address coupled to the first bank, and to receive the second bank control signal and in response generate the second address coupled to the second bank.

37. The memory of claim 36 wherein in a refresh cycle the refresh row address generator updates only one of the first and second addresses in response to the first and second select signals.

38. The memory of claim 36 wherein the refresh row address generator comprises:
first counter circuit configured to receive the first bank control signal and in response generate the first address; and
a second counter circuit configured to receive the second bank control signal and in response generate the second address,
wherein in a refresh cycle, only one of the first and second counter circuits updates its address output in response to the first and second bank control signals.

39. The memory of claim 24 further comprising a third bank of memory cells wherein during the refresh cycle one of a read operation, a write operation, and a precharge operation is carried out in the third bank.

40. The memory of claim 24 further comprising a third bank wherein in three consecutive refresh cycles a content of each of an equal number of cells in each of the first, second, and third banks are refreshed, and during each of the three refresh cycles no operation is performed in at least one of the first, second, and third banks.

41. The memory of claim 24 wherein the memory is a DRAM.

42. The memory of claim 24 wherein the refresh request signal is an auto-refresh signal generated in response to a refresh command externally provided to the memory in order to initiate a refresh cycle.

43. A method of operating a semiconductor memory having first and second banks of memory cells, a refresh address generator, and a bank access block, the method comprising:
in a refresh cycle, refreshing a content of each of a predesignated number of cells in one of the first and second banks while no operation is performed in the other one of the first and second banks;
the refresh address generator providing an address to said one of the first and second banks for selecting the predesignated number of cells in the refresh cycle; and
the bank access block providing first and second access signals to the first and second banks, one of the first and second access signals inhibiting access to said other one of the first and second banks so that no operation is performed in said other one of the first and second banks during the refresh cycle, and the other one of the first and second access signals enabling access to said one of the first and second banks to refresh a content of each of the predesignated number of cells in the refresh cycle.

44. The method of claim 43 further comprising:
in two consecutive refresh cycles, refreshing a content of each of an equal number of cells in each of the first and second banks, wherein during one of the two refresh cycles no operation is performed in the first bank, and during the other one of the two refresh cycles no operation is performed in the second bank.

45. The method of claim 44 wherein by the end of the two refresh cycles a content of each of an equal number of rows of cells in each of the first and second banks are refreshed.

46. The method of claim 43 further comprising:
performing a predesignated number of refresh cycles each having a predesignated time period so that a content of each cell along all rows of cells in each of the first and second banks is refreshed, wherein no operation is performed in one of the first and second banks in each of the predesignated number of refresh cycles.

47. The method of claim 43 wherein the predesignated number of cells is one or more rows of cells.

48. The method of claim 43 wherein the memory further includes a bank select logic, the method further comprising:
the bank select logic generating a bank select signal in response to a refresh request signal;
the refresh-address generator generating the address for selecting the predesignated number of cells in response to the bank select signal; and
the bank-access block generating the first and second bank access signals in response to the bank select signal.

49. The method of claim 48 further comprising enabling the refresh address generator in response to the refresh request signal.

50. The method of claim 48 wherein the bank select signal comprises a first select signal being in a first state when the first bank is to remain non-operational in a refresh cycle, and a second select signal being in a first state when the second bank is to remain non-operational in a refresh cycle.

51. The method of claim 50 further comprising:
the refresh-address generator generating a first address in response to the first select signal, and a second address in response to the second select signal, the first address being coupled to the first bank and the second address being coupled to the second bank.

52. The method of claim 51 wherein in a refresh cycle, the first address remains unchanged if the first select signal is in the first state, but is updated if the first select signal is in a second state, and the second address remains unchanged if the second select signal is in the first state, but is updated if the second select signal is in a second state.

53. The method of claim 50 further comprising:
the bank access block generating the first access signal in response to the first select signal, and the second access signal in response to the second select signal, the first access signal being coupled to the first bank and the second access signal being coupled to the second bank.

54. The method of claim 53 further comprising:

the first access signal inhibiting access to the first bank if the first select signal is in the first state, and initiating a row access operation in the first bank to refresh a content of each of a predesignated number of cells if the first select signal is in a second state; and the second access signal inhibiting access to the second bank if the second select signal is in the first state, and initiating a row access operation in the second bank to refresh a content of each of a predesignated number of cells if the second select signal is in a second state.

55. The method of claim 50 wherein the bank select logic comprises a counter circuit and a decode circuit, the method further comprising:

the counter circuit generating a count signal in response to the refresh request signal; and the decode circuit generating the first and second select signals in response to the count signal.

56. The method of claim 55 further comprising:

the counter circuit updating the count signal to a new binary state in response to each refresh request signal; and the decode circuit generating the first select signal being in a first state in response to the count signal being in a first binary state, and generating the second select signal being in a first state in response to the count signal being in a second binary state.

57. The method of claim 50 wherein the refresh address generator comprises a bank control block and a refresh row address generator, the method further comprising:

the bank control block generating first and second bank control signals in response to the first and second select signals; and the refresh row address generator generating a first address in response to the first bank control signal for selecting a predesignated number of cells in the first bank, and a second address in response to the second bank control signal for selecting a predesignated number of cells in the second bank.

58. The method of claim 57 further comprising:

updating only one of the first and second addresses in response to the first and second select signals in a refresh cycle.

59. The method of claim 57 further comprising:

enabling the refresh row address generator in response to the refresh request signal being received in a refresh cycle.

60. The method of claim 57 wherein the refresh row address generator comprises first and second counter circuits, the method further comprising:

generating the first address in response to the first block control signal;

generating the second address in response to the second block control signal; and in a refresh cycle, updating only one of the first and second addresses in response to the first and second select signals.

61. The method of claim 43 wherein the memory further comprises a third bank of memory cells, the method further comprising:

during the refresh cycle, performing one of a read operation, a write operation, and a precharge operation in the third bank.

62. The method of claim 43 wherein the memory further comprises a third bank of memory cells, the method further comprising:

in three consecutive refresh cycles, refreshing a content of each of an equal number of cells in each of the first, second, and third banks, wherein during each of the three refresh cycles no operation is performed in at least one of the first, second, and third banks.

63. The method of claim 43 wherein the memory is a DRAM.

64. The method of claim 43 wherein the address is a row address.

65. The method of claim 48 wherein the refresh request signal is an auto-refresh signal, the method further comprising:

generating the refresh request signal in response to a refresh command externally provided to the memory to initiate a refresh cycle.

66. The memory of claim 51 further comprising:

in a refresh cycle, updating one of the first and second addresses and maintaining the other one of the first and second addresses same as in a previous refresh cycle.

* * * * *